May 13, 1969 AKIO YAMASHITA ET AL 3,444,444

PRESSURE-RESPONSIVE SEMICONDUCTOR DEVICE

Filed Oct. 17, 1966

United States Patent Office 3,444,444

Patented May 13, 1969

3,444,444
PRESSURE-RESPONSIVE SEMICONDUCTOR DEVICE

Akio Yamashita, Ikeda-shi, and Masaru Tanaka, Toyonaka-shi, Japan, assignors to Matsushita Electric Industrial Co., Ltd., Osaka, Japan, a corporation of Japan Filed Oct. 17, 1966, Ser. No. 587,130
Claims priority, application Japan, Oct. 28, 1965, 40/66,770; Nov. 4, 1965, 40/68,008; Sept. 8, 1966, 41/60,017, 41/60,018
Int. Cl. H01l *11/00, 15/00*
U.S. Cl. 317—235 3 Claims

ABSTRACT OF THE DISCLOSURE

A pressure-responsive semiconductor device having a control section consisting essentially of a region having a deep energy level impurity formed in a surface region of one conductivity type is shown. A heavily doped region of the same conductivity type as said surface region exists on said region having a deep energy level impurity. The junction between said surface region and said heavily doped region is located in the vicinity of the principal surface of the device.

The present invention relates to a semiconductor device and more particularly to a semiconductor device having a switching characteristic, said device being turned "on" with the application of pressure.

No solid state switching element has been known up to the present which is "off" when no pressure is applied and which is turned "on" with the application of pressure.

It is an object of the invention to provide a solid state semiconductor device having the above-mentioned characteristic.

Conventional semiconductor switching elements include those having a negative resistance characteristic of the current-controlled type whose structure is n-p-n-p or n-p-n-p-n or the like. However, it is a common defect of these elements that a trigger pulse must be supplied to turn said elements "on." Moreover, the voltage of said pulse must be rather large since it must be no lower than the breakdown voltage of the p-n junction.

In order to obviate the deficiency mentioned above, there has recently been put into practical use an element having a structure of n-p-n-p or n-p-n-p-n and provided with a gate electrode. By means of these elements switching action may be obtained with a gate pulse of a small power. However, all such conventional devices utilize electrical signals as a gate signal.

According to the present invention, there is provided a pressure-responsive semiconductor device having a switching characteristic wherein pressure may be employed as a gate input.

Other objects, features and advantages of the present invention will become more apparent from the following detailed description of the invention when taken in conjunction with the accompanying drawings, in which.

Figures 1, 2, 3, 4:
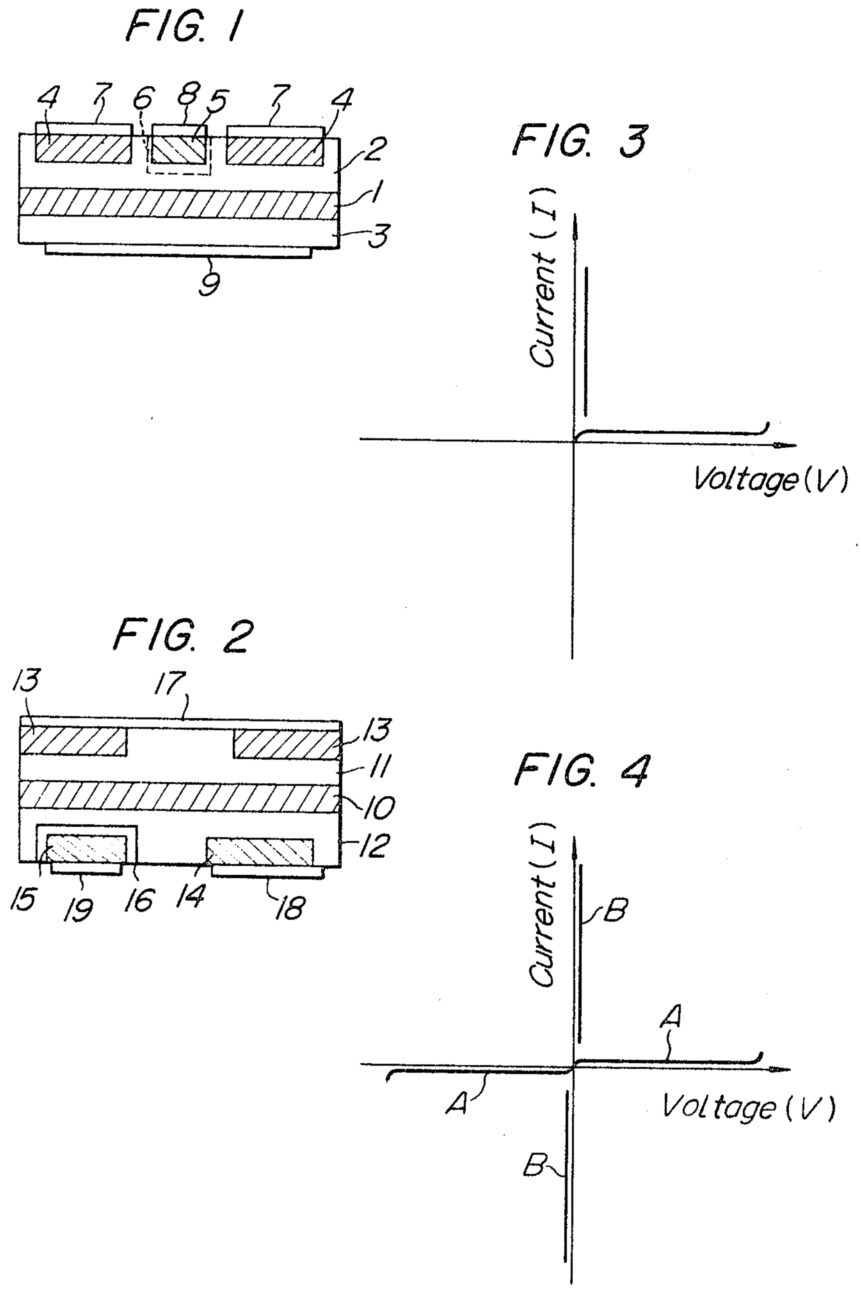
FIG. 1 is a block diagram illustrating the principle of a semiconductor device according to the present invention.
FIG. 2 is a block diagram showing a semiconductor device according to the present invention which performs a billateral switching action with the application of pressure.
FIGURE 3 shows a voltage vs. current characteristic obtained with a device as shown in FIG. 1.
FIG. 4 shows a voltage vs. current characteristic obtained with a device as shown in FIG. 2.

Referring to FIG. 1 which illustrates the fundamental structure of a device according to the present invention, reference numeral 1 designates a p-type region, 2 and 3 n-type regions formed on the respective surfaces of the p-type region 1, 4 a p-type region provided in the form of a ring within the n-type region 2, 5 and $n^+$-type region formed ni the n-type region 2 and disposed at the center of said p-type region 4, 6 a region having a deep energy level impurity formed in the n-type region 2 and positioned around the $n^+$-type region 5, 7 a ring shaped electrode in ohmic contact with the p-type region 4, 8 an electrode in ohmic contact with the $n^+$-type region 5, and 9 an electrode in ohmic contact with the n-type region 3. When a D-C voltage is applied between the electrodes 7 and 9 in such a way that the electrode 7 becomes a positive electrode, the device keeps "off" until a certain turn-on voltage is reached and an inverse bias is present at the junction between the n-type region 2 and the p-type region 1. When the applied voltage exceeds the turn-on voltage, said junction breaks down and the device is turned "on."

There is provided between the $n^+$-type region 5 and the n-type region 2 a region 6 including a deep energy level impurity, and when a D-C voltage is apllied between the electrodes 7 and 8 in such a way that the electrode 8 becomes a negative electrode, the device keeps "off" until a definite turn-on voltage is reached. When said voltage is exceeded, the device becomes "on."

This fact is explained in the following way. There is applied betwen the $n^+$-type region 5 and the n-type region 2 an inverse bias and moreover the strength of the electric field increases rapidly in the vicinity of the junction therebetween since the concentration of the impurity having a deep energy level, working as an acceptor level, is high around said junction, and so avalanche breakdown takes place at the turn-on voltage to turn the device "on." Said junction is formed in a shallow position from the surface and when pressure is applied to the electrode 8, the state of said junction between the $n^+$-type region 5 and the n-type region 2 changes from an "off" state to an "on" state. In other words, the turn-on voltage of said junction decreases as the pressure increases.

Now, let us assume that the device is "off" with a D-C voltage below the turn-on voltage applied between the electrodes 7 and 9 in such a way that the electrode 7 becomes a positive electrode and with a D-C voltage below the turn-on voltage applied between the electrodes 8 and 7 in such a way that the electrode 8 becomes a negative electrode. When pressure is applied to the electrode 8 under said conditions, the region between the electrodes 8 and 7 and the region between the electrodes 7 and 9 become "on." When the pressure is removed, the region between the electrodes 8 and 7 becomes "off," but the region between the electrodes 7 and 9 does not return to an "off" state. Namely, it is possible to turn the region between the electrodes 7 and 9 from an "off" state to an "on" state with pressure applied to the electrode 8.

It is also possible to change the current between the electrodes 8 and 7 continuously by varying the value of the pressure if the concentration gradient of the impurity in the region 6 including a high concentration of impurity forming a deep energy level is made gentle. Accordingly, it is possible to vary the turn-on voltage between the electrodes 7 and 9 with the current between the electrodes 7and 8, i.e. with the pressure applied to the electrode 8.

Only a unilateral switching action may be obtained by use of such a semiconductor device. However, bilateral switching action becomes feasible if a semi-conductor device having a structure of p-n-p-n-p or n-p-n-p-n is used.

FIG. 2 shows a semiconductor device according to the present invention which performs a bilateral switching action when pressure is applied, in which reference numeral 10 indicates a p-type region, 11 and 12 n-type regions fabricated on the respective sides of said p-type region 10 according to the vapor phase diffusion method, 13 a p-type region formed in a ring shape in a part of the n-type region 11, 14 a p-type region formed in a part of the n-type region 12, 15 an $n^+$-type region provided in another part of the n-type region 12, 16 a region having a deep energy level impurity and formed in the vicinity of the junction of the $n^+$-type region 15, 17 a metallic electrode in contact with the n-type region 11 and the p-type region 13, 18 a metallic electrode in contact with the n-type region 12 and the p-type region 14 and 19 a metallic electrode connected to the $n^+$-type region 15.

In the same figure, the components other than the regions 15 and 16 are the same with those of a conventional bilateral switching element capable of a gate action.

However, if there is provided in the vicinity of the $n^+$-type region 15 the region 16 having a deep energy level impurity, the effect of pressure sensitivity is obtained. In other words, the electrode 19 works as a gate electrode and a certain A-C voltage may be applied between the main electrodes 17 and 18 to make the region therebetween "off." A gate voltage is applied between the electrodes 18 and 19.

When the gate voltage is small, the device is in an "off" state because the region 16 is a high resistance region. However, when pressure is applied to the electrode 19, the gate region turns to an "on" state to run a gate current. Thus, the main circuit electrodes 17 and 18 are triggered to turn the device "on." This is because a high electric field induced by the gate voltage is present in the region 16 and avalanche is likely to occur to turn the device "on" when pressure is applied.

Though the true cause of the pressure-responsive or pressure-sensitive characteristics of the device of the present invention is not clear up to the present, it is conjectured that recombination-generation centers increase in the region having a deep energy level impurity to reduce the life-time of carriers and thereby to make the ionization by collision easy to occur. In such a switching element as described above, it is important to form in the vicinity of the junction of the $n^+$-type region a region having a high density of a deep energy level impurity within the gate region and in order to increase the effect of pressure sensitivity, the junction of the $n^+$-type region must be provided in the vicinity of the surface, as shown in FIGS. 1 and 2.

Now, examples of method for making the device of the present invention will be described hereinbelow.

(1) Reference is made to FIG. I. P is diffused into a p-type Si bulk 1 of a specific resistance of 5Ω-cm. from both surfaces to form n-type regions 2 and 3 on the surfaces of the Si bulk 1. Diffusion of P is performed by a known method in which $P_2O_5$ is diffused in vapor phase. Then, an alloy junction of Al (0.8 percent B) is formed at a portion as indicated by 4 in the n-type region 2. Most of Al in the region 4 appears on the surface of the region 4 and is used to form there an electrode 7. At another portion as indicated by 6 of the region 2 Cu is diffused at a low temperature in a short interval of time after Cu has been evaporated or plated on a predetermined portion of said region 2. The diffusion temperature and the diffusion time are very important and they are controlled to prevent deep diffusion since Cu is easily diffused in Si. According to the present invention, the temperature of about 800° C. and the time of about 10 minutes turned out to be the most appropriate. After excessively remaining Cu is removed with nitric acid, an alloy junction of Au (0.8 percent Sb) is provided on the region 6 to form an $n^+$ region 5 and at the same time to finally form the region 6 as indicated in FIG. 1. Most of Au in the region 5 appears on the surface of the region 5 and is used to form there an electrode 8. The electrode 9 is formed of Au (0.8 percent Sb). The voltage vs. current characteristic of a switching element as shown in FIG. 1 which is fabricated in the aforementioned way is shown in FIG. 3.

The region between the electrodes 7 and 9 is in an "off" state at 100 v. and the region between the electrodes 7 and 8 is also in an "off" state at 20 v. When the electrode 8 is pushed, the region between the electrodes 7 and 8 turns to an "on" state and then the region between the electrodes 7 and 9 is also turned "on." The phenomenon that the region between the electrodes 7 and 9 is turned "on" by a current between the electrodes 7 and 8 is based on the same principle as that of a known controlled rectifier.

(2) Reference is made to FIG. 2. P is diffused in vapor phase into a p-type Si wafer 10 of a specific resistance of 20 Ω-cm. from both surfaces to form n-type regions 11 and 12 in the vicinity of the surfaces thereof. Then, a p-type region 13 is formed in the n-type region 11 by use of Al (0.8 percent B) according to the alloy method. In the n-type region 12 a p-type region 14 is formed of Al (0.8 percent B) at a portion of the n-type region 12 as indicated according to the alloy method. Then Cu is diffused into the n-type region 12 to form a region 16 at a portion as indicated, and further by making an allow junction of Au (0.8 percent Sb) on the region 16 an $n^+$-type region 15 is formed. The control of the diffusion temperature and the diffusion time is important also in the diffusion of Cu. The electrodes 18 and 19 may be made from Al in the region 14 and Au in the region 15 respectively. The electrode 17 may be made of Al.

FIG. 4 shows a voltage (V) vs. current (I) characteristic obtained with a semiconductor device fabricated according to the aforesaid method. Curve A shows a V–I characteristic obtained when no pressure is applied, i.e. in the cut-off state when a gate signal is absent. Though the turn-on voltage depends on the geometrical size of the junction in the device, it becomes about a few hundred volts. Curve B shows the V–I characteristic when pressure is applied, said pressure being of the order of magnitude obtained when the electrode 19 is pushed by hand. In this case, a gate current flows to provide an "on" state. As the pressure increases, the turn-on voltage of the gate region decreases and accordingly it becomes easier to turn the device "on." In other words, the device may be turned "on" with a lower gate voltage. Moreover, since the main circuit of this device has a pair structure of p-n-p-n-p, bilateral switching may be obtained.

It should be noted that though the regions of the body of semiconductor are specified hereinabove as having a p-type conduction or an n-type conduction for convenience of description, the type of conduction of these regions may be exchanged. Further, there may be used as an impurity having a deep energy level Cu, Fe, Ni, Co, Mn, or Au.

As is fully described above, the semiconductor device according to the present invention works as a solid state switching element having a switching action controllable by pressure and it has a wide range of industrial application.

What is claimed is:

1. A pressure-responsive semiconductor device comprising a semiconductor body of one conductivity type, first and second regions formed on both surfaces of said semiconductor body and having a conductivity type different from that of said semi-conductor body, a third region provided in a portion of at least one of said first and second regions and having a conductivity type different from that of said first and second regions, and a control section provided in said one of said first and second regions, said control section having a surface means for receiving compressive force, characterized in that said control section consists of a fourth region formed in another portion of said one of said first and second regions and having a deep energy level impurity, and a heavily doped fifth region formed on said fourth region and having a conductivity type different from that of said semiconductor body, the junction between said heavily doped fifth region and said one of said first and second regions in which said fourth region is formed being located in the vicinity of a principal surface of the device whereby the device is operated in response to said compressive force applied to said control section.

2. A pressure-responsive semiconductor device as claimed in claim 1, wherein in a portion of each of said first and second regions a third region is provided having a conductivity type different from that of said first and second regions whereby the device is operated with bilateral switching characteristics in response to said compressive force applied to said control section.

3. A pressure-responsive semiconductor device as claimed in claim 1 wherein said deep energy level impurity is one selected from the group consisting of Cu, Fe, Ni, Co, Mn and Au.

References Cited

UNITED STATES PATENTS

| | | | |
|---|---|---|---|
| 3,246,172 | 4/1966 | Sanford | 307—88.5 |
| 3,261,989 | 7/1966 | Weinstein | 307—88.5 |
| 3,320,568 | 5/1967 | Russell et al. | 338—2 |
| 3,349,299 | 10/1967 | Herlet | 317—235 |

FOREIGN PATENTS

| | | |
|---|---|---|
| 945,249 | 12/1963 | Great Britain. |

JOHN W. HUCKERT, *Primary Examiner.*

J. R. SHEWMAKER, *Assistant Examiner.*

U.S. Cl. X.R.

307—308